United States Patent [19]

Banks et al.

[11] Patent Number: 4,861,438

[45] Date of Patent: Aug. 29, 1989

[54] METHOD OF MAKING PATTERNS

[75] Inventors: Christopher P. Banks, Saffron Walden; Edward Irving, Burwell, both of England

[73] Assignee: Ciba-Geigy Corporation, Ardsley, N.Y.

[21] Appl. No.: 297,372

[22] Filed: Jan. 17, 1989

[30] Foreign Application Priority Data

Jan. 27, 1988 [GB] United Kingdom ............... 8801736

[51] Int. Cl.$^4$ .................... C25D 5/48; C25D 9/02
[52] U.S. Cl. .................... 204/15; 156/659.1; 156/904; 204/56.1
[58] Field of Search .............. 204/15, 56.1; 156/656, 156/659.1, 904

[56] References Cited

U.S. PATENT DOCUMENTS

| | | | |
|---|---|---|---|
| 2,882,260 | 4/1959 | Bartl et al. | 525/382 |
| 3,542,739 | 11/1970 | Krimm et al. | 260/77.5 |
| 3,773,729 | 11/1973 | Wakimoto et al. | 528/45 |
| 4,034,017 | 7/1977 | Chang et al. | 260/859 R |
| 4,113,958 | 9/1878 | Gucker | 560/32 |
| 4,310,398 | 1/1982 | Gimpel et al. | 204/181.7 |
| 4,399,256 | 8/1983 | Gimpel et al. | 525/111 |
| 4,465,718 | 8/1984 | Gruber | 528/49 |
| 4,746,399 | 5/1988 | Demmer et al. | 156/656 |
| 4,751,172 | 6/1988 | Rodriguez | 430/314 |

FOREIGN PATENT DOCUMENTS

| | | |
|---|---|---|
| 207570 | 1/1987 | European Pat. Off. |
| 293312 | 3/1969 | U.S.S.R. |
| 1018105 | 1/1966 | United Kingdom |
| 1042478 | 9/1966 | United Kingdom |
| 1430422 | 3/1976 | United Kingdom |
| 1446199 | 8/1976 | United Kingdom |
| 1546822 | 5/1979 | United Kingdom |
| 2066275 | 7/1981 | United Kingdom |

Primary Examiner—T. M. Tufariello
Attorney, Agent, or Firm—Luther A. R. Hall

[57] ABSTRACT

A method of making a metallic pattern on a substrate having a surface comprising bare metal in predetermined areas and metal coated by a resist in remaining areas comprises (i) protecting the bare metal by electrodepositing thereon a heat-curable polymeric film having (a) a group which is reactive with an isocyanate group and (b) a blocked isocyanate group, (ii) heating the electrodeposited polymeric film to render it resistant to a solvent with which the resist is removable, (iii) removing the resist from said remaining areas using a solvent which does not remove the electrodeposited polymeric film, thereby exposing metal in said remaining areas, and (iv) etching the metal exposed in step (iii) using an etchant which does not remove the electrodeposited polymeric film, thereby leaving a metallic pattern protected by the electrodeposited polymeric film, which can be removed subsequently using a solvent therefor.

The method is useful in the production of printed circuits.

20 Claims, No Drawings

METHOD OF MAKING PATTERNS

The present invention relates to a method of making metallic patterns such as printed circuits and the like.

There are numerous methods used for the manufacture of printed circuit boards, although some of the steps used are common to the various methods.

In the case of single sided printed circuit boards, the board, comprising a copper clad base laminate, has holes drilled where desired, a resist is coated on the copper in a predetermined pattern, using screen printing or photoimaging techniques, to give a board having bare copper in some areas and copper coated by the resist in remaining areas, the bare copper is then plated with a tin-lead alloy, the resist is then removed, the copper thereby exposed is etched using an etchant which does not remove the tin-lead alloy, which is finally removed using a tin-lead alloy stripper.

In the case of double sided, plated through hole printed circuit boards, the procedure is similar, but with the following additional steps:

after the holes are drilled the board is subjected to electroless copper deposition to deposit copper on the surface of the holes (as well as over all the copper); and after applying the resist in a predetermined pattern the board is subjected to copper electroplating to deposit copper on the bare copper parts including the surface of the holes.

Disadvantages of these processes are the high cost of the tin-lead alloy stripper and the necessary subsequent cleaning; and the tin-lead stripper (usually a mixture of hydrogen peroxide and sulphuric acid) is aggressive to the boards themselves and to personnel and equipment used in carrying out the stripping.

It has been proposed in Russian Patent Specification No. 293312 to use an electrodeposited polymeric enamel to protect exposed copper during the manufacture of a printed circuit board. This enamel is cured for 20-30 minutes at temperatures above 150° C. which are undesirably high temperatures for a printed circuit board. Furthermore, after etching, the cured enamel has to be removed by treating the board in an alkaline solution at 70° to 80° C.: again these are severe conditions for a printed circuit board which can damage the base laminate. In U.S. Pat. No. 4,746,399 there is described a process in which the exposed copper is protected by an electrodeposited resin which is left uncured while the resist is removed and etching is effected. There remains a need for a process in which the electrodeposited resin has increased solvent resistance but can nevertheless be removed, after the etching step, under conditions which minimise the risk of damage of the base laminate.

It has now been found that copper left bare after formation of the resist pattern can be protected by an electrodeposited resinous film which can be heated at temperatures of 150° C. or below to give a film which is resistant to solvents used to remove the resist and resistant to etchants but which, after the etching process, can be removed using mild conditions. The film can be removed completely before subsequent processing of the printed circuit board or left in place while a solder mask resist is formed in a predetermined pattern on the board, the film then being removed selectively from areas not covered by the solder mask resist.

Accordingly, the present invention provides a method of making a metallic pattern on a substrate having a surface comprising bare metal in predetermined areas and metal coated by a resist in remaining areas which comprises (i) protecting the bare metal by electrodepositing thereon a heat-curable polymeric film having (a) a group which is reactive with an isocyanate group and (b) a blocked isocyanate group, (ii) heating the electrodeposited polymeric film, to render it resistant to a solvent with which the resist is removable, (iii) removing the resist from said remaining areas using a solvent which does not remove the electrodeposited polymeric film, thereby exposing metal in said remaining areas, and (iv) etching the metal exposed in step (iii) using an etchant which does not remove the electrodeposited polymeric film, thereby leaving a metallic pattern protected by the electrodeposited polymeric film.

The resist may be an epoxide resin applied by a screen printing process and then cured. Preferably, the resist is a photoresist coated in selected areas by applying it substantially uniformly to the substrate, which is usually a copper-clad laminate, subjecting it to actinic radiation in a predetermined pattern and then removing exposed or unexposed areas according to whether the photoresist is positive or negative respectively. Positive and negative photoresists for use in making printed circuit boards are well known materials and any of them may be used. They can be strippable under aqueous conditions or by means of an organic solvent. A further layer of metal, which can be another layer of copper or a layer of another metal such as nickel, may be deposited on bare copper areas before electrodeposition of the heat-curable polymeric film.

In the electrodeposited heat-curable film, the group reactive with an isocynate group may be a hydroxyl group, a mercapto group, a primary or secondary amino group or a carboxyl group; preferably it is a hydroxyl group. The blocked isocyanate group may be an isocyanate group blocked in a known manner by reaction with an active hydrogen atom so that the resulting blocked group is unreactive at ambient temperatures but is reactive at elevated temperatures. Such an active hydrogen atom may be, for example, in an alcoholic or phenolic hydroxyl group, a mercaptan group, a primary or secondary amino group, an imidazole group, an oxime group, a triazole group, a pyrazole group or a lactam group. Preferably, the active hydrogen atom is an alcoholic or phenolic hydroxyl group, a mercapto group, a primary or secondary amino group or an oxime group, with an alcoholic or phenolic hydroxyl group or an oxime group being particularly preferred.

In a preferred embodiment, the electrodeposited heat-curable polymeric film comprises a polymer having a hydroxyl group and a blocked isocyanate group. Such a film is conveniently electrodeposited from a composition comprising an electrodepositable heat-curable polymer in an electrodeposition medium, said polymer having a hydroxyl group, a blocked isocyanate group and a salt-forming group which is present at least partially in ionised form. Suitable such electrodepositable polymers include those obtained by reacting a hydroxyl- and salt forming group-containing polymer with a polyisocyanate to give a polymer containing hydroxyl, salt-forming and isocyanate groups, for example by using a polyisocyanate such as tolylene-2,4-diisocyanate or isophorone diisocyanate which has at least one isocyanate group which is less reactive than the other isocyanate group or groups, and reacting the isocyanate content of the resulting polymer with a blocking agent, that is a compound containing an active hydrogen atom in, for example, a compound of formula XH as hereinafter described. Alternatively, and preferably, the polyisocyanate is first reacted with the blocking agent to give an intermediate containing both free and blocked isocyanate groups and the free isocyanate content of the intermediate is reacted with the hydroxyl- and salt-forming group containing polymer. Suitable hydroxyl- and salt group-containing polymers include adducts of epoxide resins with amines or polycarboxylic, amino or mercapto acids; reaction products of phenolic hydroxyl group-containing resins with an aldehyde and an amine or an amino or mercapto acid; and copolymers of a hydroxyl group-containing vinyl monomer, e.g. a hydroxyl-containing acrylic monomer such as a hydroxyalkyl acrylate or hydroxyalkyl methacrylate, with a vinyl monomer containing a salt-forming group, e.g. an amine group-containing acrylic monomer such as a dialkylaminoalkyl acrylate or dialkylaminoalkyl methacrylate, optionally together with one or more other vinyl monomers. Especially preferred polymers of this type are copolymers of a hydroxyalkyl acrylate or methacrylate, a diaminoalkyl acrylate or methacrylate, and one or more other monomers selected from alkyl acrylates, alkyl methacrylates and styrenes, modified by reaction with a reaction product of a tolylene diisocyanate and an especially preferred blocking agent of formula XH as hereinafter described.

Other preferred electrodepositable polymers having a hydroxyl group, a blocked isocyanate group and a salt-forming group are copolymers of at least two vinyl monomers, preferably at least three vinyl monomers, at least one of the monomers having a hydroxyl group, at least one of the monomers having a blocked isocyanate group and at least one of the monomers having a salt-forming group, such as a carboxyl or amine group. Preferred such copolymers contain, by weight, 1–40%, especially 2–25% of units derived from the hydroxyl-containing monomer(s) and 0.1–10%, especially 0.2–5%, of units derived from the monomer(s) containing the blocked isocyanate group.

Suitable hydroxyl group-containing vinyl monomers for use in the preparation of the copolymers include, for example, vinylphenols, allyl alcohols, and hydroxyl group-containing acrylic monomers. Preferred such hydroxyl group-containing monomers are hydroxyalkyl acrylates and hydroxyalkyl methacrylates, particularly those where the hydroxyalkyl group contains up to 12 carbon atoms, such as 2-hydroxyethyl acrylate, 2-hydroxypropyl acrylate, 3-hydroxypropyl acrylate, 4-hydroxybutyl acrylate, 2-hydroxyheptyl acrylate (adduct of n-butyl glycidyl ether and acrylic acid, the adduct of iso-octyl glycidyl ether and acrylic acid, the corresponding methacrylates and mixtures of two or more thereof. Especially preferred such hydroxyl group-containing monomers are 2-hydroxyethyl acrylate, 2-hydroxypropyl acrylate and the corresponding methacrylates.

Suitable vinyl monomers having a blocked isocyanate group include substances having an acrylate or methacrylate group and at least one blocked isocyanate group of formula

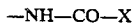   I where X denotes the residue of a compound having an active hydrogen atom, in a group reactive with an isocyanate group, after removal of said hydrogen atom.

In formula I, X may be the residue of an alcohol. a phenol, a mercaptan, a primary or secondary amine, an imidazole, an oxime, a triazole, a pyrazole or a lactam after removal of an active hydrogen atom therefrom. Preferably X denotes the residue of a compound having an isocyanate-reactive group which is an alcoholic or phenolic hydroxyl group, a group =N—OH in an oxime, a mercapto group or a primary or secondary amino group, after removal of an active hydrogen atom from the isocyanate-reactive group. Thus preferred groups X include the residue, after removal of an active hydrogen atom from an alcoholic hydroxyl group, of an aliphatic alcohol having from 1 to 25 carbon atoms, such as methanol, ethanol, isopropanol, n-butanol, n-amyl alcohol, n-dodecyl alcohol, n-octadecyl alcohol, 2-methoxypropanol, 2-n-butoxyethanol and diethyleneglycol monoethyl ether; the residue, after removal of an active hydrogen atom from a mercapto group, of a mercaptan such as n-butyl mercaptan, tert.butyl mercaptan, hexyl mercaptan, t-dodecyl mercaptan or thiophenol; and the residue, after removal of an active hydrogen atom from a primary or secondary amino group, of a primary or secondary amine such as diethylamine, n-butylamine, di-n-butylamine, aniline, N-methylaniline, diphenylamine, or phenylnaphthylamine, or of a lactam such as caprolactam.

In a more preferred embodiment, X denotes the residue, after removal of an active hydrogen atom from an alcoholic hydroxyl group, of a halogen-substituted aliphatic alcohol having 1 to 12 carbon atoms, particularly a chloro- or fluoro-substituted alcohol such as difluoromethanol, trifluoromethanol, 2-fluoroethanol, 2-chloroethanol, 2,2-difluoroethanol, 2,2-dichloroethanol, 2,2,2-trifluoromethanol, 2,2,2-trichloroethanol, 1-chloro-2-propanol, 2-chloro-1-propanol, 3-chloro-1-propanol, 1,3-difluoro-2-propanol, 1,1-dichloro-2-propanol, 3,3-dichloro-1-propanol, 1-chloro-2-butanol, 2-chloro-1-butanol, 3-chloro-1-butanol, 3-chloro-2-butanol, 4-chloro-1-butanol, 4-chloro-2-butanol, 1,3,4-trichloro-2-butanol, 2,2,3-trichloro-1-butanol, 1-chloro-2-hexanol, 1-chloro-3-hexanol, 2-chloro-3-hexanol, 5-chloro-3-hexanol and 6-chloro-1-hexanol.

In another more preferred embodiment, X denotes the residue, after removal of an active hydrogen atom from a phenolic hydroxyl group, of a phenol having from 6 to 20 carbon atoms, such as phenol, halogen substituted, particularly fluoro- and chloro-substitued, phenols such as 2,4,6-trifluorophenol, 2,3,5,6-tetrafluorophenol, pentafluorophenol, o- and p-chlorophenol, 2,4-dichlorophenol, 2,3,4-trichlorophenol, 2,4,5-trichlorophenol, 2,4,6-trichlorophenol, 2,3,4,5-tetrachlorophenol, pentachlorophenol, and nitro-substituted phenols such as o-, m- and p-nitrophenol, 2,3-dinitrophenol, 2,4-dinitrophenol, 2,5-dinitrophenol, 2,6-dinitrophenol, 3,4-dinitrophenol and 3,5-dinitrophenol.

In a further more preferred embodiment, X denotes the residue, after removal of an active hydrogen atom from a group =N—OH, of an oxime of formula

   II where $R^1$ denotes an alkyl group of 1 to 10 carbon atoms or an aryl group of 6 to 15 carbon atoms which may be substituted by halogen or a nitro group and $R^2$ denotes a hydrogen atom, an alkyl group of 1 to 10 carbon atoms or an aryl group of 6 to 15 carbon atoms, which may be substituted by halogen or a nitro group, or $R^1$ and $R^2$ together with the carbon atom to which they are attached, denote a cycloaliphatic group having 5 to 7 ring carbon atoms. Such oximes include acetaldoxime, benzaldoximine, p-nitrobenzaldoxime, acetoxime, 2-butanone oxime (methylethyl ketoxime), methylisopropyl ketoxime, methylisobutyl ketoxime, ethylhexyl ketoxime, acetophenone oxime, benzophenone oxime, o- and p-chlorobenzophenone oxime, p-fluorobenzophenone oxime, cyclopentanone oxime and cyclohexanone oxime.

Acrylic monomers containing a group of formula I where X is a residue of an oxime of formula II, and other acrylic monomers containing a blocked isocyanate group suitable for preparing copolymers for use in the process of the invention, are described in U.S. Pat. No. 4,113,958.

The acrylic monomers containing a group of formula I are preferably either reaction products of a polyisocyanate with a hydroxyl group-containing acrylic material and a compound of formula

XH     III where X denotes a residue as hereinbefore defined, or reaction products of an isocyanate group-containing acrylic material with a compound of formula III.

Preferred compounds of formula III are those where X is a preferred residue as hereinbefore defined. Especially preferred compounds of formula III are phenol, 4-nitrophenol, 2,2,2-trifluoroethanol, 2-butanone oxime, methylisobutyl ketoxime, cyclohexanone oxime and acetophenone oxime.

The polyisocyanate is preferably an aliphatic, cycloaliphatic or aromatic diisocyanate such as 1,2-propylene, 1,3-propylene, 1,2-butylene, 1,4-butylene and hexamethylene diisocyanates, 1,2-cyclohexylene and 1,4-cyclohexylene diisocyanates, isophorone diisocyanate (3-isocyanatomethyl-3,5,5-trimethylcyclohexylisocyanate), m- and p-phenylene diisocyanates, 2,4- and 2,6-tolylene diisocyanates, 1-chloro-2,4-diisocyanatobenzene, 1,4-naphthalene diisocyanate, 4,4'-diphenylmethane diisocyanate and 4,4'-diphenylether diisocyanate. Amongst these, the aromatic diisocyanates are preferred, especially tolylene-2,4-diisocyanate.

Preferred hydroxyl-containing acrylic materials are hydroxyalkyl acrylates and hydroxyalkyl methacrylates, preferably where the hydroxyalkyl group contains 1 to 12 carbon atoms, such as 2-hydroxyethyl acrylate, 2-hydroxypropyl acrylate, 3-hydroxypropyl acrylate, 4-hydroxybutyl acrylate and the corresponding methacrylates; an especially preferred material is 2-hydroxyethyl methacrylate.

The reactions of the polyisocyanate with the hydroxyl-containing acrylic material and the compound of formula III may be effected simultaneously or in either order, for example as described in U.S. Pat. No. 4,113,958. The reactions may be carried out at 30°–110° C. in an inert solvent such as benzene or toluene. The preferred reaction products are of formula

CH$_2$=C(R$^3$)COO—A—OCO—NH—B—NHCOX     IV where $R^3$ denotes hydrogen or methyl, A denotes an alkylene group, preferably of 1 to 12 carbon atoms, B denotes the residue of an aliphatic, cycloaliphatic or aromatic diisocyanate after removal of the two isocyanate groups and X is as hereinbefore defined.

It will be apparent that when the polyisocyanate has isocyanate groups of differing reactivity, the product obtained by carrying out the reaction of the polyisocyanate with the hydroxyl-containing acrylic material first will be different from that obtained by carrying out the reaction of the polyisocyanate with the compound of formula III first. Thus when an especially preferred polyisocyanate, tolylene-2,4-diisocyanate, is used, the product of formula IV is either of formula

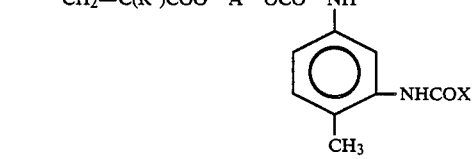

when the diisocyanate is reacted first with the hydroxyalkyl acrylate or methacrylate and then with the compound of formula III, or is of the formula

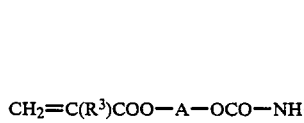

when the diisocyanate is reacted first with the compound of formula III and then with the hydroxylalkyl acrylate or methacrylate $R^3$, A and X being as hereinbefore defined.

Preferred isocyanate group-containing acrylic materials are isocyanatoalkyl acrylates and isocyanatoalkyl methacrylates, preferably those where the alkyl group contains up to 12 carbon atoms, especially 2-isocyanatoethyl acrylate and 2-isocyanatoethyl methacrylate. Reaction between the isocyanate group-containing acrylic material and the compound of formula III may be effected by heating them together in an inert solvent such as benzene or toluene, preferably in the presence of a catalyst such as a tin salt, at a temperature of 25° to 80° C. The product obtained from an isocyanatoalkyl (meth)acrylate is of formula

CH$_2$=C(R$^3$)COO—A—NHCOX     VII where $R^3$, A and X are as hereinbefore defined. Examples of suitable blocked isocyanate group-containing acrylic materials prepared by this route are described in U.S. Pat. Nos. 2,882,260 and 3,542,739.

Especially preferred vinyl monomers having a blocked isocyanate group are:

reaction products of tolylene-2,4-diisocyanate with 2-hydroxyethyl methacrylate and a compound selected from 2,2,2-trifluoromethanol, phenol, 4-nitrophenol, 2-butanone oxime, methylisobutyl ketoxime, cyclohexanone oxime or acetophenone oxime and reaction products of 2-isocyanatoethyl methacrylate with a compound selected from 2,2,2-trifluoroethanol, phenol, 4-nitrophenol, 2-butanone oxime, methylisobutyl ketoxime, cyclohexanone oxime or acetophenone oxime.

Specific especially preferred vinyl monomers having a blocked isocyanate group are the product of reacting tolylene-2,4-diisocyanate first with 2-hydroxyethyl methacrylate, then with (a) 2-butanone oxime to give a compound of formula V where $R^3$ is —$CH_3$, A is —$CH_2CH_2$— and X is —$N\!=\!C(CH_3)CH_2CH_3$, or with (b) 4-nitrophenol to give a compound of formula V where $R^3$ is —$CH_3$, A is —$CH_2CH_2$— and X is 4-nitrophenoxy, or with (c) methylisobutyl ketoxime to give a compound of formula V where $R^3$ is —$CH_3$, A is —$CH_2CH_2$— and X is —$N\!=\!C(CH_3)CH_2CH(CH_3)CH_3$;

the product of reacting tolylene-2,4-diisocyanate first with 2,2,2-trifluoroethanol, then with 2-hydroxyethyl methacrylate to give a compound of formula VI where $R^3$ is —$CH_3$, A is —$CH_2CH_2$— and X is —$OCH_2CF_3$;

the product of reacting tolylene-2,4-diisocyanate first with cyclohexanone oxime, then with 2-hydroxyethyl methacrylate to give a compound of formula VI where $R^3$ is —$CH_3$, A is —$CH_2CH_2$— and X is

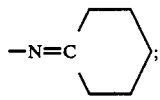

the reaction product of 2-isocyanatoethyl methacrylate with phenol, i.e. a compound of formula VII where $R^3$ is —$CH_3$, A is —$CH_2CH_2$— and X is phenoxy; and the product of reacting tolylene-2,4-diisocyanate first with acetophenone oxime, then with 2-hydroxyethyl methacrylate to give a compound of formula VI where $R^3$ is —$CH_3$, A is —$CH_2CH_2$— and X is —$N\!=\!C(CH_3)Ph$ where Ph is a phenyl group.

In preferred embodiments where the copolymers are copolymers of at least three monomers, vinyl monomers having a salt-forming group suitable for copolymerisation with the hydroxyl-containing vinyl monomer and the blocked isocyanate-containing vinyl monomer to give an electrodepositable polymer include vinyl monomers having a tertiary amine group, for example N-vinylpyridine and, preferably, acrylic monomers containing a tertiary amine group; and vinyl monomers having an acid group, for example vinylsulphonic acid and, preferably, vinyl carboxylic acids. Preferred acrylic monomers having a tertiary amine group are dialkylaminoalkyl acrylates and dialkylaminoalkyl methacrylates, especially 2-(dimethylamino)ethyl acrylate, 2-(diethylamino)ethyl acrylate, 2-(dimethylamino)propyl acrylate and the corresponding methacrylates. Preferred vinyl carboxylic acids are acrylic and methacrylic acids.

The electrodepositable copolymers may include units derived from other vinyl monomers copolymerised with the hydroxyl-containing vinyl monomer, the blocked isocyanate-containing vinyl monomer and the salt-forming group-containing vinyl monomer. These other vinyl monomers may be, for example, alkyl acrylates and methacrylates such as methyl acrylate, ethyl acrylate, n-butyl acrylate, n-hexyl acrylate, 2-ethylhexyl acrylate and the corresponding methacrylates; vinyl esters such as vinyl acetate and vinyl propionate; vinyl halides such as vinyl chloride and vinylidene chloride; and styrenes such as styrene, alpha-methyl styrene, p-methylstyrene, and p-chlorostyrene. Amongst these, alkyl acrylates and methacrylates and styrenes are preferred.

Especially preferred electrodepositable copolymers having a hydroxyl group, a blocked isocyanate group and salt-forming group are copolymers of a hydroxyalkyl acrylate or hydroxyalkyl methacrylate with a blocked isocyanate group-containing vinyl monomer as hereinbefore described, a salt-forming group-containing vinyl monomer as hereinbefore described and one or more other vinyl monomers selected from an alkyl acrylate, an alkyl methacrylate or a styrene.

In another preferred embodiment of the process of the invention, the electrodeposited heat-curable polymeric film comprises, instead of or in addition to the polymer having a hydroxyl group and a blocked isocyanate group, a mixture of a hydroxyl group-containing polymer and a blocked isocyanate. Such a film is conveniently electrodeposited from a composition comprising, in an electrodeposition medium, a mixture of a blocked isocyanate and an electrodepositable heat-curable polymer having a hydroxyl group and a salt-forming group which is present at least partially in ionised form. Suitable such electrodepositable polymers include any of the (blocked isocyanate-free) hydroxyl- and salt-forming group-containing polymers hereinbefore described. Preferred such polymers are adducts of an epoxide resin, particularly an advanced epoxide resin such as an advanced diglycidyl ether of a bisphenol, with an amine, preferably a secondary amine such as diethanolamine, diisopropanolamine, diethylamine, di-n-butylamine, piperidine or morpholine; copolymers of a hydroxyl group-containing vinyl monomer, preferably a hydroxyl-containing acrylic monomer such as a hydroxyalkyl acrylate or hydroxyalkyl methacrylate, with a vinyl monomer containing a salt-forming group as hereinbefore described, preferably a tertiary amine group-containing acrylate or methacrylate such as a dialkylaminoalkyl acrylate or dialkylaminoalkyl methacrylate or a vinyl carboxylic acid such as acrylic acid or methacrylic acid and, preferably, with one or more other vinyl monomers, especially selected from an alkyl acrylate, alkyl methacrylate or a styrene as hereinbefore described.

Blocked isocyanates suitable for use in admixture with the hydroxyl- and salt-forming group-containing polymer may be those having, per average molecule, more than one group of formula $$—NH—CO—X \qquad\qquad\qquad\qquad\qquad\text{I}$$

where X, preferred residues X and more preferred residues X are as hereinbefoe described. Such blocked isocyanates can be prepared by reacting a material having, per average molecule, more than one isocyanate group, with a compound of formula $$XH \qquad\qquad\qquad\qquad\qquad\text{III}$$

where X is as hereinbefore defined, using the procedures for isocyanate —XH reactions hereinbefore described, to convert substantially all of the isocyanate content to —NHCOX. The material having on average more than one isocyanate group per molecule may be an isocyanate-terminated prepolymer derived from a polyol and a polyisocyanate; preferably it is a diisocyanate as hereinbefore described for use in the preparation of acrylic polymers containing a group of formula I, with tolylene-2,4-diisocyanate being especially preferred.

In mixtures as hereinbefore described, the weight ratio of hydroxyl- and salt-forming group-containing polymer to blocked isocyanate is usually from 1:1 to 1000:1, preferably from 10:1 to 750:1, especially from 20:1 to 500:1.

The various vinyl polymers hereinbefore described can be prepared by conventional polymerisation processes using free radical polymerisation initiators such as organic peroxides and azo compounds, preferably to give polymers having a number average molecular weight of at last 5000, especially 5000 to 15,000.

Thus the monomers may be heated with the initiator in solution in an organic solvent, preferably an organic solvent whch is miscible with the electrodeposition medium. Conventional chain transfer agents such as tert.dodecyl mercaptan can be used when desired.

The electrodepositable heat-curable hydroxy-, blocked isocyanate- and salt-forming group-containing polymer and/or the mixture of a blocked isocyanate and the hydroxyl- and salt-forming group-containing polymer may be neutralised, at least partially, before dissolution or dispersion in the electrodeposition medium to convert the salt-forming group, at least partially, into ionised form. Preferably, however, this neutralisation is effected by the addition of a suitable acid or base to the electrodeposition medium. The salt-forming group is usually at least 10% neutralised, preferably 40 to 70% neutralised.

Where the salt-forming group is basic, electrodeposition in step (i) is preferably effected from a solution or dispersion in an aqueous medium together with an acid which at least partially neutralises the basic group. Where the salt-forming group is acidic, electrodeposition in step (i) is preferably effected from a solution or dispersion in an aqueous medium together with a base which at least partially neutralises the acidic group. When both acidic and basic groups are present, electrodeposition in stage (i) can be effected from a solution or dispersion in an aqueous medium together with an acid or base. The aqueous medium may contain a water-miscible organic solvent to assist dissolution or dispersion of the polymer and/or mixture. This solvent may be, for example, the solvent in which the blocked isocyanate-containing polymer or the hydroxyl-containing polymer is prepared. Suitable organic solvents include ketones such as acetone, methyl ethyl ketone and methyl isobutyl ketone, alcohols such as ethanol, 2-methoxyethanol, 2-ethoxyethanol, 2-n-butoxyethanol, diethylene glycol monobutyl ether and dipropylene glycol monomethyl ether, and esters such as 2-methoxypropyl acetate and 2-ethoxyethyl acetate.

Accordingly, compositions suitable for carrying out the process of the invention as hereinbefore described comprise a solution or dispersion in an aqueous solvent of a mixture of (a) a polymer having a hydroxyl group, a blocked isocyanate group and a salt-forming group, or a mixture of a polymer having a hydroxyl group and a salt-forming group with a blocked isocyanate, as hereinbefore described, and (b) an acid or base which at least partially neutralises the salt-forming group. Conventional additives such as dyes, pigments, fillers, plasticisers and surfactants can be included in the composition. Generally the composition has a solids content of 2 to 40%, by weight.

Suitable acids for effecting neutralisation are organic and inorganic acids such as acetic, lactic, trichloroacetic, methanesulphonic, glycolic, p-toluenesulphonic, hydrochloric and sulphuric acids. Suitable bases for effecting neutralisation are organic and inorganic bases such as triethylamine, triethanolamine, pyridine, morpholine, sodium or potassium hydroxide, sodium or potassium carbonate or sodium or potassium ethoxide.

Electrodeposition of the heat-curable polymeric film may be carried out using conventional electrodeposition procedures for resinous materials. Voltages up to 200 volts for periods of up to 5 minutes are generally used, but the precise conditions for particular electrodeposited materials, substrates and desired thicknesses may be readily determined by those skilled in the art of electrodepositing resinous materials.

Voltages as low as 2 volts may be used in some cases, especially if the size of the electrode on which the polymeric film is deposited is small in relation to the other electrode. For example a cathodically depositable polymeric film may be deposited on a small cathode in a tank where the whole of the tank is the anode, at voltages of 2 volts or 5 volts.

The electrodeposited polymeric film is preferably dried, for example by heating at a temperature lower than that to be used for curing, before it is heated to render it resistant to the solvent to be used for removal of the resist. Heating in step (ii) is generally effected to a temperature of 60° to 150° C., preferably 100° to 150° C.

An aqueous solvent may be used to remove the resist in step (iii). After the etching step (iv), at least part of the electrodeposited film may be removed using a solvent therefor. It is possible to use a combination of a resist and an electrodeposited polymeric film which are both strippable under acidic aqueous conditions or both strippable under basic aqueous conditions provided that the resist is strippable under milder conditions than are needed to remove the electrodeposited film, e.g. a more dilute solution of acid or base.

When an organic solvent is used to remove the resist in step (iii), a suitable solvent which does not dissolve the electrodeposited film can be found by routine experimentation. Both this solvent and the solvent used subsequently to remove the electrodeposited film can be selected from halohydrocarbons such as 1,1,1-trichloroethane and dichloromethane, hydroxylic solvents such as 2-n-butoxyethanol and 2-ethoxyethanol, esters such as 2-ethoxyethyl acetate, ketones such as acetone, methyl ethyl ketone and cyclohexanone and ethers such as tetrahydrofuran.

The temperature and duration of the heating required in in step (ii) to render the electrodeposited film resistant to the solvent used in step (iii), but leave the film soluble in a solvent to be used to remove the film after the etching step (iv), can be readily determined by routine experimentation.

Preferably, the resist is removed in step (iii) using an aqueous solvent and at least part of the electrodeposited film is removed using an organic solvent, the resist and film being chosen accordingly.

In step (iv) of the process of the invention, the metal exposed by removal of the resist, usually copper, may be removed by any well known etchant such as ferric chloride, hydrogen peroxide/phosphoric acid, ammonium persulphate or cupric chloride.

At the end of step (iv), the substrate has a surface comprising predetermined areas of metal covered by the electrodeposited film and predetermined areas from which the metal has been removed by the etching process. Where the initial substrate is a copper-clad plastics laminate, at the end of step (iv) the surface comprises predetermined areas of copper covered by the electrodeposited polymeric film and areas in which the laminate base is devoid of copper.

After the etching, at least part of the electrodeposited polymeric film may be removed using a solvent therefor to leave bare copper areas for electrical connections. In one embodiment, a further resist to act, for example, as a solder mask is formed in a predetermined pattern over the electrodeposited film, thereby leaving areas of the electrodeposited film uncovered by the further resist, and said uncovered areas of the electrodeposited film are then removed. The pattern formation of the further resist can be effected by applying a photocurable resin composition directly in a predetermined pattern using a screen printing technique and irradiating the screen printed layer to effect cure thereof. Photocurable resin compositions which can be applied by screen printing are well known to those skilled in the art of making printed circuit boards. The photocurable resins can be, for example, resins containing polymerisable acrylate or methacrylate ester groups used together with free radical-generating photoinitiators therefor.

Preferably, the further resist is a photoresist which is applied in a layer over the electrodeposited film, irradiated in a predetermined pattern, thereby effecting a difference in solubility between exposed and unexposed parts thereof, and treated with a solvent to remove more soluble parts, this treatment with solvent also removing electrodeposited film underlying the more soluble parts of the irradiated photoresist.

Conventional positive and negative photoresists may be used as the further resist. They may be irradiated with actinic radiation in a predetermined pattern using known procedures.

Removal of more soluble areas of the irradiated photoresist and the parts of the electrodeposited film underlying those areas is effected by treatment with a solvent chosen according to the nature of the photoresist, and may be water, an aqueous (including aqueous organic) solution of an acid or base or an organic solvent or mixture of solvents. Suitable acid solutions include those of acetic, lactic, glycolic or toluene-p-sulphonic acids, while suitable basic solutions include those of sodium or potassium hydroxide or carbonate. Suitable organic solvents include hydrocarbons such as toluene and xylene, halohydrocarbons such as 1,1,1-trichloroethane and dichloromethane, hydroxylic solvents such as ethanol, 2-n-butoxyethanol and 2-ethoxyethanol, esters such as 2-ethoxyethyl acetate, ketones such as cyclohexanone, acetone and methyl ethyl ketone and ethers such as tetrahydrofuran. A suitable solvent can be found by routine experimentation.

When the photoresist used as the further resist is a negative photoresist, areas not exposed to radiation are removed by treatment with solvent. When a positive photoresist is used as the further resist, usually areas exposed to radiation are removed by treatment with solvent, although if an image reversal process is used, for instance with a quinone diazide photoresist, the areas initially exposed to radiation are subsequently rendered less soluble than the other areas so that the areas not exposed to radiation are removed by treatment with solvent.

In particularly preferred embodiments of the process of the invention when a further resist is applied, the first resist is removed by aqueous solvents, the more soluble parts of the irradiated further resist are removed by means of an organic solvent, and the electrodeposited film is removed by means of an organic solvent used to remove the further resist.

The process of the invention is very useful in the production of multilayer printed circuit boards, particularly those having plated through holes or vias.

The invention is illustrated by the following Examples in which all parts and percentages are by weight unless otherwise indicated.

The blocked isocyanates and polymers used in the Examples are prepared as follows:

Technical Grade tolylene-2,4-diisocyanate used in the preparations is a mixture of 80% tolylene-2,4-diisocyanate and 20% tolylene-2,6-diisocyanate.

Blocked Isocyanate I

Technical grade tolylene-2,4-diisocyanate (0.1 mole, 0.2 isocyanate equivalents) is added dropwise to a mixture of phenol (0.2 mole), dibutyltin dilaurate (0.2 g) and dry toluene (100 ml) over 30 minutes. The resulting mixture is heated at 50° C. until infra-red spectral analysis of a sample of the mixture indicates the absence of free isocyanate groups. The mixture is then cooled, and the solid precipitated on cooling is filtered off, washed with diethyl ether and dried in a vacuum to give a solid product with melting point 131°–133° C.

Blocked Isocyanates II to VI

These are prepared by the following general procedure:

Technical grade tolylene-2,4-diisocyanate (0.1 mole) is added dropwise over 30 minutes to a mixture of Reactant A (0.1 mole), dibutyltin dilaurate (0.2 g) and dry toluene (100 ml). The resulting mixture is heated at 50° C. for 18 hours. Reactant B (0.1 mole) is added over 30 minutes and heating at 50° C. is continued until infra-red spectral analysis of a sample of the mixture indicates the absence of free isocyanate groups. The mixture is then cooled and subjected to one of the following work-up procedures:

(1) If a solid is precipitated on cooling, this is filtered off, washed with diethyl ether and dried in a vacuum.

(2) If no solid is precipitated, the mixture is concentrated to dryness on a rotary evaporator under vacuum.

Blocked Isocyanate II

This is prepared using 2-hydroxyethyl methacrylate as Reactant A, 2-butanone oxime as Reactant B, and work-up procedure (2). The product is viscous liquid.

Blocked Isocyanate III

This is prepared using 2-hydroxyethyl methacrylate as Reactant A, 4-nitrophenol as Reactant B and work-up procedure (1). The product is a solid of melting point 104°–106° C.

IR (KBr disc) 3350, 1710, 1595, 1530, 1482, 1450, 1347, 1300, 1220, 1200, 1080, 1020, 990, 862, 812 cm$^{-1}$ NMR (Acetone-d$_6$) 1.9 (s-3H), 2.32 (s-3H), 4.4(s-4H), 5.6+6.1 (m-2H), 6.9–8.8 (m-9H) δ

Blocked Isocyanate IV

This is prepared using 2,2,2-trifluoroethanol as Reactant A, 2-hydroxyethyl methacrylate as Reactant B and work-up procedure (1). The product is a solid of melting point 95°–97° C.

IR (KBr disc) 3360, 3290, 2962, 1695, 1600, 1530, 1450, 1410, 1320, 1290, 1225, 1165, 1100, 1080, 995, 957, 870, 858, 818, 761 cm$^{-1}$ NMR (CDCl$_3$) 1.92 (s-3H), 2.18 (s-3H), 4.37(m-6H), 5.55+6.10(m-2H), 6.4–7.7(m-5H)δ

Blocked Isocyanate V

This is prepared using 2-hydroxyethyl methacrylate as Reactant A, methylisobutyl ketoxime as Reactant B, and work-up procedure (2). The product is an opaque paste.

IR (Squash) 3340, 2955, 1710, 1595, 1525, 1490, 1450, 1320, 1295, 1220, 1168, 1082, 1020, 995, 950, 905, 878, 815, 731 cm$^{-1}$ NMR (Acetone-d$_6$) 0.8–2.9(m-18H), 4.35(d-4H), 5.6+6.1(m-2H), 7.09–9.0(m-5H) δ

Blocked Isocyanate VI

This is prepared using cyclohexanone oxime as Reactant A, 2-hydroxyethyl methacrylate as Reactant B and work-up procedure (2). A viscous liquid product is obtained.

IR (Squash) 3300, 2935, 1715, 1595, 1525, 1448, 1410, 1320, 1295, 1228, 1170, 1078, 1030, 997, 912, 880, 815, 732 cm$^{-1}$.

NMR(Acetone-d$_6$) 1.5–3.0(m-16H), 4.37(s-4H), 5.6+6.1(m-2H), 7.0–9.0(m-5H) δ

Blocked Isocyanate VII

A mixture of 2-isocyanatoethyl methacrylate (7.75 g) and dry toluene (20 ml) is added over 30 minutes to a mixture of phenol (4.7 g), dibutyltin dilaurate (0.1 g) and dry toluene (20 ml). The resulting mixture is stirred at room temperature until infra-red spectral analysis of a sample of the mixture indicates the absence of free isocyanate, and is then evaporated to dryness as a rotary evaporator under vacuum. The product is a solid of melting point 98°–100° C.

IR (KBR disc) 3330, 1730, 1690, 1625, 1531, 1490, 1325, 1300, 1250, 1200, 1110, 1040, 980, 945, 920, 870, 820, 700 cm$^{-1}$ NMR (CDCl$_3$) 2.0(d-3H), 3.4–4.5(t+t-4H), 5.7+6.15(m-3H), 7.0–7.5(m-5H)δ

Blocked Isocyanate VIII

Technical grade tolylene-2,4-diisocyanate (17.4 g; 0.1 mole) is added dropwise over 30 minutes to a mixture of 2-butanone oxime (8.7 g; 0.1 mole), dibutyltin dilaurate (0.2 g) and dry toluene (100 ml). The resulting mixture is heated at 50° C. for 18 hours and then evaporated to dryness on a rotary evaporator under vacuum to give a product in which one isocyanate group of the diisocyanate has been blocked by reaction with the butanone oxime.

Blocked Isocyanate IX

This is prepared by the procedure used for Blocked Isocyanates II to VI, using acetophenone oxime as Reactant A, 2-hydroxyethyl methacrylate as Reactant B and work-up procedure (2). A viscous liquid product is obtained.

IR (Squash) 3310, 2942, 1710, 1592, 1520, 1443, 1409, 1355, 1312, 1292, 1261, 1220, 1165, 1075, 990, 960, 900, 810, 760, 690 cm$^{-1}$.

NMR (CDCl$_3$) 1.9–2.6 (m-9H), 3.8(s-1H), 4.4(d-3H), 5.6+6.15 (t+s-2H), 6.6–8.1(m-10H)δ

Polymer I

A monomer mixture consisting of styrene (47.5 parts), 2-ethylhexyl acrylate (25 parts), 2-hydroxyethyl methacrylate (19.5 parts), 2-(dimethylamino)ethyl methacrylate (7.5 parts), Blocked isocyanate II (0.5 part) and azobis(isobutyronitrile) (1.5 parts) is added dropwise over 2 hours to 2-n-butoxyethanol (50 parts) stirred at 100° C. The reaction mixture is maintained at 100° C. for a further hour and than a further charge of azobis (isobutyronitrile) (0.5 part) and 2-n-butoxyethanol (5.5 parts) is added. This procedure, namely heating at 100° C. for a further hour followed by addition of further azobis(isobutyronitrile), is repeated twice more and the reaction mixture is held at 100° C. for a further hour and then cooled to ambient temperature. The amine value of the resulting copolymer solution is 0.28 eq/kg. The number average molecular weight of the copolymer is 8114.

Polymer II

A monomer mixture consisting of styrene (47.5 parts), 2-ethylhexyl acrylate (25 parts), 2-hydroxyethyl methacrylate (18 parts), 2-(dimethylamino)ethyl methacrylate (7.5 parts), Blocked Isocyanate III (2 parts) and azobis(isobutyronitrile) (1.5 parts) in 2-n-butoxyethanol (60 parts) is heated to 100° C. The reaction mixture is maintained at 100° C. for 3 hours and then a further charge of azobis(isobutyronitrile) (0.5 part) and 2-n-butoxyethanol (5.5 parts) is added. The reaction mixture is maintained at 100° C. for a further hour and a further charge of azobis(isobutyronitrile) (0.5 part) and 2-butoxyethanol (5.5 parts) added. This procedure, namely heating at 100° C. followed by addition of a further charge, is repeated and the reaction mixture is held at 100° C. for a further hour and then cooled to ambient temperature. The amine value of the resulting copolymer solution is 0.27 eq/kg. The number average molecular weight of the copolymer is 10,095.

Polymer III

A monomer mixture consisting of styrene (15 parts), methyl methacrylate (27.5 parts), 2-ethylhexyl acrylate (30 parts), 2-hydroyxethyl methacrylate (18 parts), 2-(dimethylamino)ethyl methacrylate (7.5 parts), Blocked Isocyanate IV (2 parts) and azobis(isobutyronitrile) (1.5 parts) in 2-n-butoxyethanol (60 parts) is heated to 100° C. The reaction mixture is maintained at 100° C. for 3 hours and a further charge of azobis(isobutyronitrile) (0.5 part) and 2-n-butoxyethanol (5.5 parts) is added. The reaction mxiture is maintained at 100° C. for a further hour and a further charge of azobis(isobutyronitrile) (0.5 part) and 2-n-butoxyethanol (5.5 parts) is added. This procedure, namely heating at 100° C. followed by addition of a further charge, is repeated and the mixture is held at 100° C. for a further hour and then cooled to ambient temperature. The amine value of the resulting copolymer solution is 0.28 eq/kg. The number average molecular weight of the copolymer is 10,036.

Polymer IV

A monomer mixture consisting of styrene (60 parts), 2-ethylhexyl acrylate (27.5 parts), 2-hydroxyethyl methacrylate (3.5 parts), 2-(dimethylamino) ethyl methacrylate (5 parts), Blocked Isocyanate VII (4 parts) and azobis(isobutyronitrile) (1.5 parts) in 2-n-butoxyethanol (50 parts) is heated to 120° C. The reaction mixture is maintained at 120° C. for 3 hours and a further charge of azobis(isobutyronitrile) (0.5 part) and 2-n-butoxyethanol (5.5 parts) is added. The reaction mixture is maintained at 120° C. for a further hour and a further charge of azobis(isobutyronitrile) (0.5 part) in 2-n-butoxyethanol (5.5 parts) is added. This procedure, namely heating at 120° C. for 1 hour, then adding a further charge, is repeated and the reaction mixture is held at 120° C. for a further hour and then cooled to ambient temperature. The amine value of the resulting copolymer solution is 0.19 eq/kg. The number average molecular weight of the copolymer is 6210.

Polymer V

A monomer mixture consisting of styrene (47.5 parts), 2-ethylhexyl acrylate (25 parts), 2-hydroxyethyl methacrylate (18 parts), 2-(dimethylamino)ethyl methacrylate (7.5 parts), Blocked Isocyanate V (2 parts) and azobis(isobutyronitrile) (1.5 parts) is added dropwise over 2 hours to 2-n-butoxyethanol (50 parts) stirred at 100° C. The reaction mixture is maintained at 100° C. for a further hour and a further charge of azobis(isobutyronitrile (0.5 part) and 2-n-butoxyethanol (5.5 parts) is added. This procedure, namely heating at 100° C. for 1 hour, then adding a further charge, is repeated twice more and the reaction mixture is held at 100° C. for a further hour and then cooled to ambient temperature. The amine value of the resulting copolymer solution is 0.29 eq/kg. The number average molecular weight of the copolymer is 11,110.

Polymer VI

A monomer mixture is consisting of styrene (47.5 parts), 2-ethylhexyl acrylate (25 parts), 2-hydroxyethyl methacrylate (18 parts), 2-(dimethylamino)ethyl methacrylate (7.5 parts), Blocked Isocyanate VI (2 parts) and azobis(isobutyronitrile) (1.5 parts) is added dropwise over 2 hours to 2-n-butoxyethanol (50 parts) stirred at 100° C. The reaction mixture is maintained at 100° C. for a further hour and a further charge of azobis (isobutyronitrile) (0.5 part) and 2-n-butoxyethanol (5.5 parts) is added. This procedure, namely heating at 100° C. for 1 hour, then adding a further charge, is repeated twice more and the reaction mixture is held at 100° C. for a further hour and then cooled to ambient temperature. The amine value of the resulting copolymer solution is 0.29 eq/kg. The number average molecular weight of the copolymer is 12,347.

Polymer VII

A monomer mixture consisting of styrene (47.5 parts), 2-ethylhexyl acrylate (25 parts), 2-hydroxyethyl methacrylate (20 parts), 2-(dimethylamino) ethyl methacrylate (7.5 parts) and azobis(isobutyronitrile) (1.5 parts) is added dropwise over 2 hours to Dowanol DPM (dipropylene glycol monomethyl ether) (50 parts) stirred at 100° C. The reaction mixture is maintained at 100° C. for a further hour and a further charge of azobis(isobutyronitrile) (0.5 part) and Dowanol DPM (5.5 parts) is added. This procedure, namely heating at 100° C. for 1 hour then adding a further charge, is repeated twice more and the reaction mixture is held at 100° C. for a further hour and cooled to 50° C. A mixture of Blocked Isocyanate VIII (2 parts) and Dowanol DPM (2 parts) is added. The reaction mixture is stirred at 50° C. until infra-red spectral analysis of a sample indicates no free isocyanate, then cooled to ambient temperature. The amine value of the resulting copolymer solution is 0.27 eq/kg.

Polymer VIII

A monomer mixture consisting of styrene (55 parts), 2-ethylhexyl acrylate (21 parts), 2-hydroxyethyl methacrylate (20 parts) and methacrylic acid (4 parts) with azobis(isobutyronitrile) (1.5 parts) is added dropwise over 2 hours to 2-n-butoxyethanol (50 parts) stirred at 100° C. The reaction mixture is maintained at 100° C. for a further hour and a further charge of azobis(isobutyronitrile) (0.5 part) and 2-n-butoxyethanol (10 parts) is added. This procedure, namely heating at 100° C. for 1 hour then adding a further charge, is repeated twice more and the reaction mixture is held at 100° C. for a further hour. 2-n-butoxyethanol (20 parts) is added and the mixture is cooled to ambient temperature. It is then evaporated at 100° C. under vacuum on a rotary evaporator to remove unreacted monomers. The acid value of the resulting copolymer solution is 0.21 eq/kg and the number average molecular weight of the copolymer is 11,260.

Polymer IX

An epoxide resin prepared by advancing a diglycidyl ether of bisphenol A by reaction with bisphenol A (epoxide content 1.55 equivs/kg, 100 parts) is heated to 140° C. together with 2-n-butoxyethanol (47.3 parts) to form a solution. To this solution is added diethanolamine (16.7 parts) and the mixture is maintained at 140° C. until the epoxide content is zero. The resulting solution is cooled to 70° C. and aqueous 75% lactic acid (9.6 parts) is added, followed by water (15.7 parts). The solution is then cooled to ambient temperature.

Polymer X

A monomer mixture consisting of styrene (47.5 parts), 2-ethylhexyl acrylate (25 parts), 2-hydroxyethyl methacrylate (20 parts) and 2-(dimethylamino)ethyl methacrylate (7.5 parts) with azobis(isobutyronitrile) (1.5 parts) is added dropwise over 2 hours to 2-n-butoxyethanol (50 parts) stirred at 100° C. The reaction mixture is maintained at 100° C. for a further hour and a further charge of azobis(isobutronitrile) (0.5 part) and 2-n-butoxyethanol (5.5 parts) is added. This procedure, namely heating at 100° C. for 1 hour then adding a further charge, is repeated twice more and the reaction mixture is held at 100° C. for a further hour and then cooled to ambient temperature. The amine value of the resulting copolymer solution is 0.28 eq/kg and the number average molecular weight of the copolymer is 10,416.

Polymer XI

A monomer mixture of styrene (40 parts), ethyl hexyl acrylate (32.5 parts), 2-hydroxyethyl methacrylate (18 parts), 2-(dimethylamino)ethyl methacrylate (7.5 parts) and Blocked Isocyanate IX (2 parts) is stirred with azobis(isobutyronitrile) (1 part) and 2-butoxyethanol (67 parts) at 80° C. for 4 hours. Another charge of azobis(isobutyronitrile) (0.5 part) is added and the mixture is heated at 80° C. for a further 16 hours. After this time a further charge of azobis(isobutyronitrile) (0.5 part) is added and the mixture is heated at 80° C. for a further 4 hours and then cooled to ambient temperature. The amine value of the resulting copolymer solution is 0.28 eq/kg.

The RISTON photoresist used in the Examples is an acrylic photoresist available from Du Pont (UK) Ltd., Riston Division, Wedgewood Way, Stevenage, Hertfordshire SG1 4QN, England.

Robertsons Aqueous Film Stripper 279H used in the Examples is an aqueous 7% solution of ethanolamine, obtained by diluting the aqueous 70% solution of ethanolamine available from Robertsons Chemicals Ltd., Shepherds Grove Industrial Estate West, Stanton, Bury St. Edmunds, Suffolk IP31 2AR.

EXAMPLE 1

A copper-clad laminate coated with a RISTON aqueous developable negative photoresist, which has been imaged and developed to form a pattern in the RISTON photoresist, thereby leaving areas where copper is exposed, is used as the cathode in an electrodeposition bath equipped with a stainless steel anode. The electrodeposition bath contains the following solution:
Polymer I: 100 parts
Aqueous 20% lactic acid: 6.8 parts
Water: 493.2 parts A voltage of 30 volts is applied for 60 seconds. The copper-clad laminate is removed from the bath, rinsed with water and dried at 110° C. for 5 minutes. The electrodeposited film coats the areas where copper is exposed. The dried laminate is baked at 150° C. for 20 minutes and then immersed in a stirred bath of Robertsons Aqueous Film Stripper 279H at 50° C. This treatment removes the photoresist leaving the electrodeposited polymer.

The copper exposed by removing the photoresist is etched away by immersion in an etch bath containing ammonium persulphate (125 g), concentrated sulphuric acid (20 g) and water (980 g) at 50° C. After rinsing the etched laminate in water and drying, immersion in a bath of acetone completely removes the electrodeposited polymer leaving a clear pattern, in copper, on the laminate base.

EXAMPLE 2

A copper-clad laminate coated with a RISTON aqueous developable negative photoresist, which has been imaged and developed to form a pattern in the RISTON photoresist, thereby leaving areas where copper is exposed, is used as the cathode in an electrodeposition bath equipped with a stainless steel anode. The electrodeposition bath contains the following solution:
Polymer II: 100 parts
Aqueous 20% lactic acid: 10 parts
Water: 490 parts A voltage of 60 volts is applied for 60 seconds. The copper-clad laminate is removed from the bath, rinsed with water and dried at 110° C. for 5 minutes. The electrodeposited film coats the areas where copper is exposed. The dried laminate is baked at 150° C. for 20 minutes and then immersed in a stirred bath of Robertsons Aqueous Film Stripper 279H at 50° C. This treatment removes the photoresist leaving the electrodeposited polymer.

The copper exposed by removing the photoresist is etched away by immersion in an etch bath containing ammonium persulphate (125 g), concentrated sulphuric acid (20 g) and water (980 g) at 50° C. After rinsing the etched laminate in water and drying, immersion in a bath of acetone completely removes the electrodeposited polymer, leaving a clear pattern, in copper, on the laminate base.

EXAMPLE 3

A copper-clad laminate coated with a RISTON aqueous developable negative photoresist, which has been imaged and developed to form a pattern in the RISTON photoresist, thereby leaving areas where copper is exposed, is used as the cathode in an electrodeposition bath equipped with a stainless steel anode. The electrodeposition bath contains the following solution:
Polymer III: 100 parts
Aqueous 20% lactic acid: 6.8 parts
Water: 493.2 parts A voltage of 50 volts is applied for 60 seconds. The copper-clad laminate is removed from the bath, rinsed with water and dried at 110° C. for 5 minutes. The electrodeposited film coats the areas where copper is exposed. The dried laminate is baked at 150° C. for 20 minutes and then immersed in a stirred bath of Robertsons Aqueous Film Stripper 279H at 50° C. This treatment removes the photoresist leaving the electrodeposited polymer.

The copper exposed by removing the photoresist is etched away by immersion in an etch bath containing ammonium persulphate (125 g), concentrated sulphuric acid (20 g) and water (980 g) at 50° C. After rinsing the etched laminate in water and drying, immersion in a bath of acetone completely removes the electrodeposited polymer, leaving a clear pattern, in copper, on the laminate base.

EXAMPLE 4

A copper-clad laminate coated with a RISTON aqueous developable negative photoresist, which has been imaged and developed to form a pattern in the RISTON photoresist, thereby leaving areas where copper is exposed, is used as the cathode in an electrodeposition bath equipped with a stainless steel anode. The electrodeposition bath contains the following solution:
Polymer IV: 100 parts
Aqueous 20% lactic acid: 6.7 parts
Water: 493.3 parts A voltage of 70 volts is applied for 60 seconds. The copper-clad laminate is removed from the bath, rinsed with water and dried at 110° C. for 5 minutes. The electrodeposited film coats the areas where copper is exposed. The dried laminate is baked at 150° C. for 20 minutes and then immersed in a stirred bath of Robertsons Aqueous Film Stripper 279H at 50° C. This treatment removes the photoresist leaving the electrodeposited polymer.

The copper exposed by removing the photoresist is etched away by immersion in an etch bath containing ammonium persulphate (125 g), concentrated sulphuric acid (20 g) and water (980 g) at 50° C. After rinsing the etched laminate in water and drying, immersion in a bath of acetone completely removes the electrodeposited polymer, leaving a clear pattern, in copper, on the laminate base.

EXAMPLE 5

A copper-clad laminate coated with a RISTON aqueous developable negative photoresist which has been imaged and developed to form a pattern in the RISTON photoresist, thereby leaving areas where copper is exposed, is used as the cathode in an electrodeposition bath equipped with a stainless steel anode. The electrodeposition bath contains the following solution:
Polymer V: 100 parts
Aqueous 20% lactic acid: 6.8 parts
Water: 493.2 parts A voltage of 40 volts is applied for 60 seconds. The copper-clad laminate is removed from the bath, rinsed with water and dried at 110° C. for 5 minutes. The electrodeposited polymer film coats the areas where copper is exposed. The dried laminate is baked at 150°

C. for 20 minutes and then immersed in a stirred bath of Robertsons Aqueous Film Stripper at 50° C. This treatment removes the photoresist leaving the electrodeposited polymer.

The copper exposed by removing the photoresist is etched away by immersion in an etch bath containing ammonium persulphate (125 g), concentrated sulphuric acid (20 g) and water (980 g) at 50° C. After rinsing the etched laminate in water and drying, immersion in a bath of acetone completely removes the electrodeposited polymer, leaving a clear pattern, in copper, on the laminate base.

EXAMPLE 6

A copper-clad laminate coated with a RISTON aqueous developable negative photoresist, which has been imaged and developed to form a pattern in the RISTON photoresist, is used as the cathode in an electrodeposition bath equippred with a stainless steel anode. The electrodeposition bath contains the following solution:
Polymer VI: 100 parts
Aqueous 20% lactic acid: 10 parts
Water: 490 parts A voltage of 60 volts is applied for 60 seconds. The copper-clad laminate is removed from the bath, rinsed with water and dried at 110° C. for 5 minutes. The electrodeposited film coats the areas where copper is exposed. The dried laminate is baked at 150° C. for 20 minutes and then immersed in a stirred bath of Robertsons Aqueous Film Stripper 279H at 50° C. This treatment removes the photoresist leaving the electrodeposited polymer.

The copper exposed by removing the photoresist is etched away by immersion in an etch bath containing ammonium persulphate (125 g), concentrated sulphuric acid (20 g) and water (980 g) at 50° C. After rinsing the etched laminate in water and drying, immersion in a bath of acetone completely removes the electrodeposited polymer, leaving a clear pattern, in copper, on the laminate base.

EXAMPLE 7

A copper-clad laminate coated with a RISTON aqueous developable negative photoresist, which has been imaged and developed to form a pattern in the RISTON photoresist, thereby leaving areas where copper is exposed, is used as the cathode in an electrodeposition bath equipped with a stainless steel anode. The electrodeposition bath contains the following solution:
Polymer X: 100 parts
Aqueous 20% lactic acid: 6.8 parts
Water: 493.0 parts
Blocked Isocyanate I: 0.2 part A voltage of 60 volts is applied for 60 seconds. The copper-clad laminate is removed from the bath, rinsed with water and dried at 110° C. for 5 minutes. The electrodeposited film coats the areas where copper is exposed. The dried laminate is bakd at 150° C. for 20 minutes and then immersed in a stirred bath of Robertsons Aqueous Film Stripper 279H at 50° C. This treatment removes the photoresist leaving the electrodeposited polymer.

The copper exposed by removing the photoresist is etched away by immersion in an etch bath containing ammonium persulphate (125 g), concentrated sulphuric acid (20 g) and water (980 g) at 50° C. After rinsing the etched laminate in water and drying, immersion in a bath of acetone completely removes the electrodeposited polymer, leaving a clear pattern, in copper, on the laminate base.

EXAMPLE 8

A copper-clad laminate coated with a RISTON aqueous developable negative photoresist, which has been imaged and developed to form a pattern in the RISTON photoresist, thereby leaving areas where copper is exposed, is used as the cathode in an electrodeposition bath equipped with a stainless steel anode. The electrodeposition bath contains the following solution:
Polymer VII: 100 parts
Aqueous 20% lactic acid: 6.8 parts
Water: 433.2 parts
2-n-butoxyethanol: 60 parts A voltage of 25 volts is applied for 60 seconds. The copper-clad laminate is removed from the bath, rinsed with water and dried at 110° C. for 5 minutes. The electrodeposited film coats the areas where copper is exposed. The dried laminate is baked at 150° C. for 20 minutes and then immersed in a stirred bath of Robertsons Aqueous Film Stripper 279H at 50° C. This treatment removes the photoresist leaving the electrodeposited polymer.

The copper exposed by removing the photoresist is etched away by immersion in an etch bath containing ammonium persulphate (125 g), concentrated sulphuric acid (20 g) and water (980 g) at 50° C. After rinsing the etched laminate in water and drying, immersion in a bath of acetone completely removes the electrodeposited polymer leaving a clear pattern, in copper, on the laminate base.

EXAMPLE 9

A copper-clad laminate coated with a RISTON aqueous developable negative photoresist, which has been imaged and developed to form a pattern in the RISTON photoresist, thereby leaving areas where copper is exposed, is used as the anode in an electrodeposition bath equipped with a stainless steel cathode. The electrodeposition bath contains the following solution:
Polymer VIII: 100 parts
Aqueous 20% potassium hydroxide: 4.7 parts
Water: 392.3 parts
Blocked Isocyanate I: 3 parts A voltage of 50 volts is applied for 60 seconds. The copper-clad laminate is removed from the bath, rinsed with water and dried at 110° C. for 5 minutes. The electrodeposited film coats the areas where copper is exposed. The dried laminate is baked at 140° C. for 20 minutes and then immersed in a stirred bath of Robertsons Aqueous Film Stripper 279H at 50° C. This treatment removes the photoresist leaving the electrodeposited polymer.

The copper exposed by removing the photoresist is etched away by immersion in an etch bath containing ammonium persulphate (125 g), concentrated sulphuric acid (20 g) and water (980 g) at 50° C. After rinsing the etched laminate in water and drying, immersion in a bath of dichloromethane completely removes the electrodeposited polymer leaving a clear pattern, in copper, on the laminate base.

EXAMPLE 10

A copper-clad laminate coated with a RISTON aqueous developable negative photoresist, which has been imaged and developed to form a pattern in the RISTON photoresist, thereby leaving areas where copper is exposed, is used as the cathode in an electrodeposition bath equipped with a stainless steel anode. The electrodeposition bath contains the following solution:
Polymer IX: 100 parts
Blocked Isocyanate I: 3.3 parts
Water: 563.3 parts A voltage of 30 volts is applied for 2 seconds. The copper-clad laminate is removed from the bath, rinsed with water and dried at 110° C. for 5 minutes. The electrodeposited film coats the areas where copper is exposed. The dried laminate is baked at 140° C. for 20 minutes and then immersed in a stirred bath of Robertsons Aqueous Film Stripper 279H at 50° C. This treatment removes the photoresist leaving the electrodeposited polymer.

The exposed copper is etched away by immersion in an etch bath containing ammonium persulphate (125 g), concentrated sulphuric acid (20 g) and water (980 g) at 50° C. After rinsing the etched laminate in water and drying, immersion in a bath of dichloromethane completely removes the electrodeposited polymer leaving a clear pattern, in copper, on the laminate base.

EXAMPLE 11

A copper-clad laminate coated with a RISTON aqueous developable negative photoresist, which has been imaged and developed to form a pattern in the photoresist, thereby leaving areas where copper is exposed, is used as the cathode in an electrodeposition bath equipped with a stainless steel anode and containing a solution of Polymer XI (100 parts) and aqueous 20% lactic acid (6.8 parts) in water (493.2 parts). A voltage of 20 volts is applied for 60 seconds. The copper-clad laminate is removed from the bath, rinsed with water and dried at 110° C. for 5 minutes. The electrodeposited film coats the areas where copper is exposed. The dried laminate is baked at 130° C. for 30 minutes and then immersed in a stirred bath of Robertsons Aqueous Film Stripper 279H at 50° C. This treatment removes the photoresist leaving the electrodeposited polymer. The copper exposed by removing the photoresist is etched away by immersion in an etch bath containing ammonium persulphate (125 g), concentrated sulphuric acid (20 g) and water (980 g) at 50° C. After rinsing the etched laminate in water and drying, immersion in acetone completely removes the electrodeposited polymer leaving a clear pattern, in copper, on the laminate base.

What is claimed is:

1. A method of making a metallic pattern on a substrate having a surface comprising bare metal in predetermined areas and metal coated by a resist in remaining areas which comprises
   (i) protecting the bare metal by electrodepositing thereon a heat-curable polymeric film having (a) a group which is reactive with an isocyanate group and (b) a blocked isocyanate group,
   (ii) heating the electrodeposited polymeric film to render it resistant to a solvent with which the resist is removable,
   (iii) removing the resist from said remaining areas using a solvent which does not remove the electrodeposited polymeric film, thereby exposing metal in said remaining areas, and
   (iv) etching the metal exposed in step (iii) using an etchant which does not remove the electrodeposited polymeric film, thereby leaving a metallic pattern protected by the electrodeposited polymeric film.

2. A method according to claim 1, in which the electrodeposited polymeric film comprises a polymer having a hydroxyl group and a blocked isocyanate group which is electrodeposited from a composition comprising an electrodepositable heat-curable polymer in an electrodeposition medium, said polymer having a hydroxyl group, a blocked isocyanate group and a salt-forming group which is present at least partially in ionised form.

3. A method according to claim 2, in which the polymer is a copolymer of at least three vinyl monomers, at least one of the monomers being a hydroxyalkyl acrylate or hydroxyalkyl methacrylate, at least one of the monomers being a vinyl monomer having a blocked isocyanate group and at least one of the monomers being an acrylic monomer having a tertiary amine group or a vinyl carboxylic acid.

4. A method according to claim 3, in which the copolymer contains 0.2–5% by weight of units derived from the monomer or monomers containing a blocked isocyanate group.

5. A method according to claim 3, in which the monomer having the blocked isocyanate group is a substance having an acrylate or methacrylate group and at least one blocked isocyanate group of formula $$-NH-CO-X \qquad I$$

where X denotes the residue of a compound having an active hydrogen atom, in a group reactive with an isocyanate group, after removal of said hydrogen atom.

6. A method according to claim 5, in which X denotes the residue of a compound having an isocyanate-reactive group which is an alcoholic or phenolic hydroxyl group, a group =N—OH in an oxime, a mercapto group or a primary or secondary amino group, after removal of an active hydrogen atom from the isocyanate-reactive group.

7. A method according to claim 6, in which the monomer having a blocked isocyanate group is
   a reaction product of a polyisocyanate with a hydroxyl group-containing acrylic material and a compound of formula $$XH \qquad III$$

where X is as defined in claim 6, or
   a reaction product of an isocyanate group-containing acrylic material with a compound of formula III.

8. A method according to claim 7, in which the monomer having a blocked isocyanate group is
   a reaction product of tolylene-2,4-diisocyanate with 2-hydroxyethyl methacrylate and a compound selected from 2,2,2-trifluoroethanol, phenol, 4-nitrophenol, 2-butanone oxime, methylisobutyl ketoxime, cyclohexanone oxime or acetophenone oxime; or
   a reaction product of 2-isocyanatoethyl methacrylate with a compound selected from 2,2,2-trifluoroethanol, phenol, 4-nitrophenol, 2-butanone oxime, methylisobutyl ketoxime, cyclohexanone oxime or acetophenone oxime.

9. A method according to claim 3, in which the monomer having a salt-forming gorup is a dialkylaminoalkyl acrylate, a dialkylaminoalkyl methacrylate, acrylic acid or methacrylic acid.

10. A method according to claim 6, in which the copolymer is a copolymer of a hydroxyalkyl acrylate or hydroxyalkyl methacrylate with a monomer having a blocked isocyanate group as defined in claim 6, a salt-forming group-containing monomer which is an acrylic monomer having a tertiary amine group or a vinyl carboxylic acid, and one or more vinyl monomers selected from an alkyl acrylate, an alkyl methacrylate or a styrene.

11. A method according to claim 2, in which the polymer is obtained by first reacting a polyisocyanate with a compound of formula $$XH \qquad \qquad III$$

where X denotes the residue of a compound having an active hydrogen atom, in a group reactive with an isocyanate group, after removal of said hydrogen atom, to give an intermediate containing both free and blocked isocyanate groups and then reacting the free isocyanate content of the intermediate with a hydroxyl- and salt-forming group-containing polymer.

12. A method according to claim 11, in which the polymer is a copolymer of a hydroxyalkyl acrylate or hydroxyalkyl methacrylate, a dialkylaminoalkyl acrylate or dialkylaminoalkyl methacrylate, and one or more vinyl monomers selected from an alkyl acrylate, an alkyl methacrylate or a styrene, modified by reaction with a reaction product of a tolylene diisocyanate and a compound of formula III which is phenol, 4-nitrophenol, 2,2,2-trifluoroethanol, 2-butanone oxime, methylisobutyl ketoxime, cyclohexanone oxime or acetophenone oxime.

13. A method according to claim 1, in which the electrodeposited polymeric film comprises a mixture of a hydroxyl group-containing polymer and a blocked isocyanate which is electrodeposited from a composition comprising, in an electrodeposition medium, a mixture of a blocked isocyanate and an electrodepositable heat-curable polymer having a hydroxyl group and a salt-forming group present at least partially in ionised form.

14. A method according to claim 13, in which the electrodepositable polymer is an adduct of an epoxide resin with a secondary amine; or a copolymer of a hydroxyalkyl acrylate or hydroxyalkyl methacrylate, a tertiary amine group-containing acrylate or methacrylate or a vinyl carboxylic acid, and one or more vinyl monomers selected from an alkyl acrylate, an alkyl methacrylate or a styrene.

15. A method according to claim 13, in which the blocked isocyanate has, per average molecule, more than one group of formula $$-NH-CO-X \qquad \qquad I$$

where X denotes the residue of a compound having an isocyanate-reactive group which is an alcoholic or phenolic hydroxyl group, a group $=N-OH$ in an oxime, a mercapto group or a primary or secondary amino group, after removal of an active hydrogen from the isocyanate-reactive group.

16. A method according to claim 1, in which the electrodeposited polymeric film is heated in step (ii) at a temperature of 100° to 150° C.

17. A method according to claim 2, in which after step (iv) at least part of the electrodeposited polymeric film is removed using a solvent therefor.

18. A method according to claim 17, in which the resist is removed in step (iii) using an aqueous solvent and the electrodeposited polymeric film is removed using an organic solvent.

19. A method according to claim 1, in which the metallic pattern is a printed circuit and the metal is copper.

20. A metallic pattern made by a method according to claim 1.

* * * * *